(12) United States Patent
Kim et al.

(10) Patent No.: US 6,202,590 B1
(45) Date of Patent: Mar. 20, 2001

(54) PLASMA APPARATUS FOR FABRICATING SEMICONDUCTOR DEVICES

(75) Inventors: Kiw-sang Kim; Young-min Min, both of Kyungki-do; In-sung Park, Incheon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/404,805

(22) Filed: Sep. 24, 1999

(30) Foreign Application Priority Data

Sep. 25, 1998 (KR) ................................................ 98-39952
Jul. 8, 1999 (KR) ................................................ 99-27461

(51) Int. Cl.$^7$ .................................................. C23C 16/00
(52) U.S. Cl. ................ 118/723 R; 118/728; 118/723 E; 156/345
(58) Field of Search ........................ 156/345; 118/723 R, 118/723 E, 723 ER, 723 I, 723 IR, 723 AN, 723 MW, 728

(56) References Cited

U.S. PATENT DOCUMENTS

| | | | |
|---|---|---|---|
| 5,476,182 | * 12/1995 | Ishizuka et al. | 216/68 |
| 5,478,429 | * 12/1995 | Komino et al. | 156/345 |
| 5,865,937 | * 2/1999 | Shan et al. | 156/345 |
| 6,010,636 | * 1/2000 | Donohue et al. | 216/71 |
| 6,042,686 | * 3/2000 | Dible et al. | 156/345 |
| 6,046,425 | * 4/2000 | Kaji et al. | 219/121.43 |

* cited by examiner

Primary Examiner—Gregory Mills
Assistant Examiner—Luz L. Alejandro
(74) Attorney, Agent, or Firm—Jones Volentine, L.L.C.

(57) ABSTRACT

A plasma apparatus for fabricating a semiconductor device, is provided. This plasma apparatus includes a grounded chamber for providing a space where a predetermined process is to be performed, a chuck mounted within the chamber and insulated from the chamber, a gas injection ring installed around the sidewall of the chuck, an induction plasma power source connected to the chuck, a system controller for controlling the induction plasma power source, and a capacitance compensator for keeping the total chuck capacitance between the chuck and a ground terminal at a constant value. The gas injection ring is separated from the chuck by a predetermined distance and is electrically connected to the chamber.

20 Claims, 6 Drawing Sheets

PLASMA APPARATUS FOR FABRICATING SEMICONDUCTOR DEVICES

This application relies for priority upon Korean Patent Application Nos. 98-39952 and 99-27461, filed on Sep. 25, 1998, and Jul. 8, 1999, respectively, the contents of which are herein incorporated by reference in their entirety.

BACKGROUND OF THE INVENTION

1. Field of the Invention

The present invention relates to an apparatus for fabricating semiconductor devices, and more particularly, to an apparatus for fabricating semiconductor devices using plasma.

2. Description of the Related Art

As the integration of semiconductor devices increases, the demand for a deposition technique to form a material film having a uniform thickness, or an etching technique showing a uniform etch rate also increases. Accordingly, a plasma apparatus for depositing a material film or etching the material film by appropriately controlling the type of ions and ion energies is being widely used for the manufacture of highly-integrated semiconductor devices. To be more specific, the plasma apparatus can be applied to dry etching, chemical vapor deposition (CVD) or sputtering techniques.

Meanwhile, a radio frequency generator is widely used as an energy source for generating the plasma used in these techniques.

FIG. 1A is a schematic of a conventional plasma apparatus, and FIG. 1B is a plan view of the chuck and the gas injection ring shown in FIG. 1A.

Referring to FIG. 1A, a chuck 5 is installed on the bottom of a chamber 10, which has an opening at the top, and a chuck support 15 made of an insulating material is interposed between the chuck 5 and the bottom of the chamber 10. A wafer on which a semiconductor device is to be formed, is loaded on the chuck 5. A gas injection ring 20 is installed around the sidewall of the chuck 5, and is fixed by a fixing means 25 such as a bolt in contact with the bottom of the chamber 10. The gas injection ring 20 is preferably attached in such a way that it is electrically connected to the chamber 10, which has a ground potential. The chuck 5 and the gas injection ring 20 are spaced apart from each other by a predetermined interval, for example, at an interval of about 1 to 5 mm. Thus, a gap exists between the chuck 5 and the gas injection ring 20, such that the gas injection ring 20 and the chuck 5 form a chuck capacitor.

The sidewall of the chamber 10 or a predetermined area of the bottom of the chamber 10 is branched and connected to a vacuum pump 30. The opening of the chamber 10 is covered by a cover 35, which is formed of a dielectric material. An electrode 40 connected to a first plasma power source 45a for generating radio frequency power, is installed over the cover 35. Thus, when the first plasma power source 45a is turned on, plasma is generated within the chamber 10.

A first radio frequency matching circuit 50a for maximizing the transmission efficiency of radio frequency power generated from the first plasma power source 45a is interposed between the first plasma power source 45a and the electrode 40. The chuck 5 is connected to a second plasma power source 45b, which is used to induce plasma generated within the chamber 10 by the first plasma power source 45a over the chuck 5.

A gas injection passage for supplying process gas into the chamber 10 is installed within the gas injection ring 20. The gas injection passage is connected to a tank 55 which contains a gas source, via a gas inlet. A second radio frequency matching circuit 50b having the same function as that of 50a is interposed between the second plasma power source 45b and the chuck 5. A valve 60 for controlling the flow of gas is installed at a predetermined position on the gas inlet between the tank 55 and the gas injection ring 20. The valve 60 and the pump 30 are controlled by a valve control signal $\Phi_v$ and a pump control signal $\Phi_p$, respectively, which are generated from a system controller 65 that controls the operation of the plasma apparatus. The system controller 65 receives signals from the first and second plasma power sources 45a and 45b and detects an on/off state of each of the first and second plasma power sources 45a and 45b.

As described above, the total chuck capacitance between the chuck 5 and a ground terminal is directly affected by the change in chuck capacitance between the chuck 5 and the gas injection ring 20. Thus, when the chuck capacitance is changed, the total chuck capacitance is also changed. The total chuck capacitance in turn directly affects a plasma process. This means that when the total chuck capacitance is changed, the sheath potential between the chuck 5 and the plasma induced over the chuck 5 by the second plasma power source 45b is changed. When the sheath potential is changed as described above, process parameters for the plasma process are changed. For example, the process parameters are an etch rate, a deposition rate or the like. Hence, the total chuck capacitance between the chuck 5 and the ground terminal must be kept constant to obtain excellent process uniformity.

Meanwhile, the plasma apparatus must be periodically pre-maintained as are other apparatuses used to fabricate semiconductor devices. This pre-maintenance is required since another factor that changes the process parameters is generated by the absorption of a contaminant on the inner wall of the chamber as the process time or the frequency of processing increases. Thus, the plasma apparatus must undergo a pre-maintenance operation of disassembling the plasma apparatus, cleaning the respective component elements including the chamber, and reassembling the disassembled component elements. During the pre-maintenance operation, an operation involving measuring and controlling the gap between the chuck 5 and the gas injection ring 20 using a gage or the like, is performed several times to adjust the gap to within an allowable range. This operation is manually performed, requiring a great amount of time to perform, and making it difficult to accurately adjust the gap to within the allowable range. As a result of this, when the chuck 5 and the gas injection ring 20 are assembled such that they do not have the same center as shown in FIG. 4B, a first gap $G_1$ on the left side of the chuck 5 and a second gap $G_2$ on the right side of the chuck 5 can be different. In other words, the gap between the chuck 5 and the gas injection ring 20 may not be the same at all positions around the chuck 5. When the gap between the chuck 5 and the gas injection ring 20 is not uniform as described above, the chuck capacitance may exceed an allowable range. Accordingly, as the total chuck capacitance changes, the uniformity of the process can be degraded.

While a process gas is sprayed into the chamber 10 via the gas injection ring 20, a physical force due to the pressure or the like of the process gas, is applied to the gas injection ring 20. In addition, minute vibrations can be generated in the plasma apparatus when it is used for a long time. Thus, even when the gas injection ring 20 is fixed to the chamber 10 by the fixing means 25, the position of the gas injection ring 20 can change when the plasma process is performed for a long time. When the position of the gas injection ring 20 changes as described above, the gap between the chuck 5 and the gas injection ring 20 changes. Accordingly, chuck capacitance changes, and the total chuck capacitance also changes.

As described above, the total chuck capacitance between the chuck 5 and the grounding terminal of the conventional plasma apparatus cannot be kept constant.

SUMMARY OF THE INVENTION

To solve the above problems, it is an object of the present invention to provide a plasma apparatus including a capacitance compensator for keeping constant the total chuck capacitance between a ground terminal and a chuck on which a wafer is to be mounted, regardless of a pre-maintenance operation.

It is another object of the present invention to provide a plasma apparatus for keeping process parameters constant.

Accordingly, to achieve the above objects, the present invention provides a plasma apparatus including: a grounded chamber having a space where a predetermined process may be performed; a chuck mounted in the chamber and insulated from the chamber; a chuck plasma power source connected to the chuck; a system controller for controlling the chuck plasma power source; and a capacitance compensator for keeping the total chuck capacitance between the chuck and a ground terminal at a constant value. Also, the present invention may further include a gas injection ring installed around the sidewall of the chuck. The gas injection ring is separated from the chuck by a predetermined distance and is electrically connected to the chamber.

The gas injection ring has a gas injection passage formed therein, and a process gas is injected into the chamber through the gas injection passage. The gas injection ring is fixed to the chamber by a fixing means such as a bolt.

The capacitance compensator preferably includes: a variable capacitor portion interposed between the chuck and the ground terminal; and a variable capacitor controller for controlling the capacitance of the variable capacitor to keep the total chuck capacitance constant.

The variable capacitor portion is connected between the chuck and a ground terminal, and preferably includes at least one variable capacitor. To be more specific, the variable capacitor portion includes at least one capacitor selected from the combination of a serial capacitor connected to a chuck capacitor in series, and a parallel capacitor connected in parallel with the chuck capacitor. Here, the chuck capacitor comprises the chuck and the grounded chamber. However, in a case where the present invention includes the gas ring, the chuck capacitor comprises the chuck and the gas injection ring. Also, at least one of the selected capacitors must be a variable capacitor.

Meanwhile, the variable capacitor controller controls the capacitance of the variable capacitor portion by changing the gap between the electrodes of at least one variable capacitor that constitutes the variable capacitor portion. Thus, when the chuck capacitance between the chuck and the gas injection ring changes, the total chuck capacitance between the chuck and the ground terminal can be kept at a constant value by appropriately controlling the variable capacitance. Consequently, the total chuck capacitance can be kept at a constant value without correctly adjusting the gap between the chuck and the gas injection ring installed within the chamber, but rather by appropriately controlling the variable capacitance. Here, in the case where the present invention does not include the gas injection ring, the total chuck capacitance is equal to the chuck capacitance.

An aspect of the variable capacitor controller includes: a motive power source for changing the gap between the electrodes of the selected variable capacitors; a capacitance meter for measuring the total chuck capacitance between the chuck and a ground terminal and outputting a predetermined signal; an automatic control signal generator for outputting an electrical signal corresponding to the difference between the output signal of the capacitance meter and a reference signal that corresponds to a desired optimal total chuck capacitance input to the system controller; and a driver portion for driving the motive power source by amplifying the output signal of the automatic control signal generator.

Preferably, the motive power source is a direct current motor that has a rotational shaft connected to an electrode of at least one variable capacitor. In this case, the selected electrode is a driven electrode, and the driven electrode moves with the rotation of the rotational shaft of the direct current motor. As a result, the gap between the electrodes of the variable capacitor increases or decreases according to the direction of rotation of the rotational shaft.

The automatic control signal generator preferably includes a comparator, most preferably, an analog comparator. The analog comparator amplifies the difference between the output signal of the capacitance meter and a reference signal corresponding to an optimal total chuck capacitance input to the system controller.

An aspect of the variable capacitor controller further includes a process state sensor interposed between the variable capacitor portion and the capacitance meter. The process state sensor electrically disconnects the capacitance meter from the variable capacitor portion while a predetermined process, e.g., an etching process or a deposition process, is being performed within the chamber. In other words, the process state sensor electrically connects the variable capacitor portion to the capacitor meter only when the predetermined process is not being performed within the chamber. Thus, the capacitance meter only measures the total chuck capacitance when a predetermined process is not being performed.

It is preferable that an aspect of the variable capacitor controller further includes a limit control portion for limiting the range within which a driven electrode of the at least one variable capacitor moves. The limit control portion preferably includes a voltage limit setting portion for setting a negative voltage limit and a positive voltage limit to limit the range within the driven electrode of the variable capacitor moves, a limit sensor for outputting a predetermined voltage according to the position of the driven electrode of the variable capacitor, a digital comparator for generating either the first or second output signal or generating neither of the first and second output signals, rectifying devices for inverting the polarity of the input signal of the driver portion according to the first or second output signal of the digital comparator, and switches for controlling the connections of the rectifying devices.

An aspect of the variable capacitor controller preferably further includes a limit display portion including first and second light emitting devices, which are respectively lighted by first and second output signals of the digital comparator from the limit control portion.

An aspect of the variable capacitor controller can further include a selection switch interposed between the automatic control signal generator and the driver portion, and a manual control signal generator connected to the selection switch. The selection switch connects the input terminal of the driver portion to the output terminal of the automatic control signal generator or connects the input terminal of the driver portion to the output terminal of the manual control signal generator. Accordingly, the variable capacitor controller in the plasma apparatus according to the present invention can be operated in either an automatic mode or a manual mode.

The manual control signal generator includes a power switch for selecting either the positive power source or the negative power source, and a variable resistor interposed between the power switch and a ground terminal. The variable terminal of the variable resistor acts as the output terminal of the manual control signal generator, and is connected to the selection switch. Thus, in order to operate the variable capacitor controller in the manual mode, the selection switch connects the input terminal of the driver portion to the output terminal of the manual control signal generator, and the variable terminal of the variable resistor connected to the power switch controls the position of the driven electrode of the variable capacitor.

Another aspect of the variable capacitor controller includes a motive power source for changing the gap between the electrodes of the variable capacitor, a capacitance meter for measuring the total chuck capacitance between the chuck and a ground terminal and outputting a signal corresponding to the measured total chuck capacitance to the system controller, a manual control signal generator for generating a desired voltage, and a driver portion for driving the motive power source by amplifying a voltage generated by the manual control signal generator. The variable capacitor controller configured as above can operate only in the manual mode, and can further include a limit control portion for limiting the range within which the driven electrode of the variable capacitor moves. The limit control portion in this alternate embodiment preferably has the same configuration and function as those of the limit control portion in the variable capacitor controller according to the preferred aspect of the present invention.

Another aspect of the variable capacitor controller preferably further includes a limit display portion which is operated by the limit control portion. The limit display portion in this alternate embodiment preferably has the same configuration and function as those of the limit display portion in the variable capacitor controller according to the preferred embodiment of the present invention.

According to the present invention, the total chuck capacitance between a chuck and a ground terminal can be maintained at an optimal total chuck capacitance without performing any pre-maintenance activities. Thus, the uniformity of a predetermined process performed within a chamber can be improved. Also, in the present invention, a special operation for precisely controlling the gap between a chuck and a gas injection ring is not required during pre-maintenance. Therefore, the time required for pre-maintenance is significantly reduced.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

A preferred embodiment of the present invention will be described below in detail with reference to the attached drawings by taking a plasma etching apparatus as an example. However, the present invention is not limited to such a plasma etching apparatus, and can be applied to all kinds of semiconductor fabricating apparatuses which use plasma. For example, the semiconductor fabricating apparatus could be a plasma deposition apparatus, or the like.

Figure 1A:
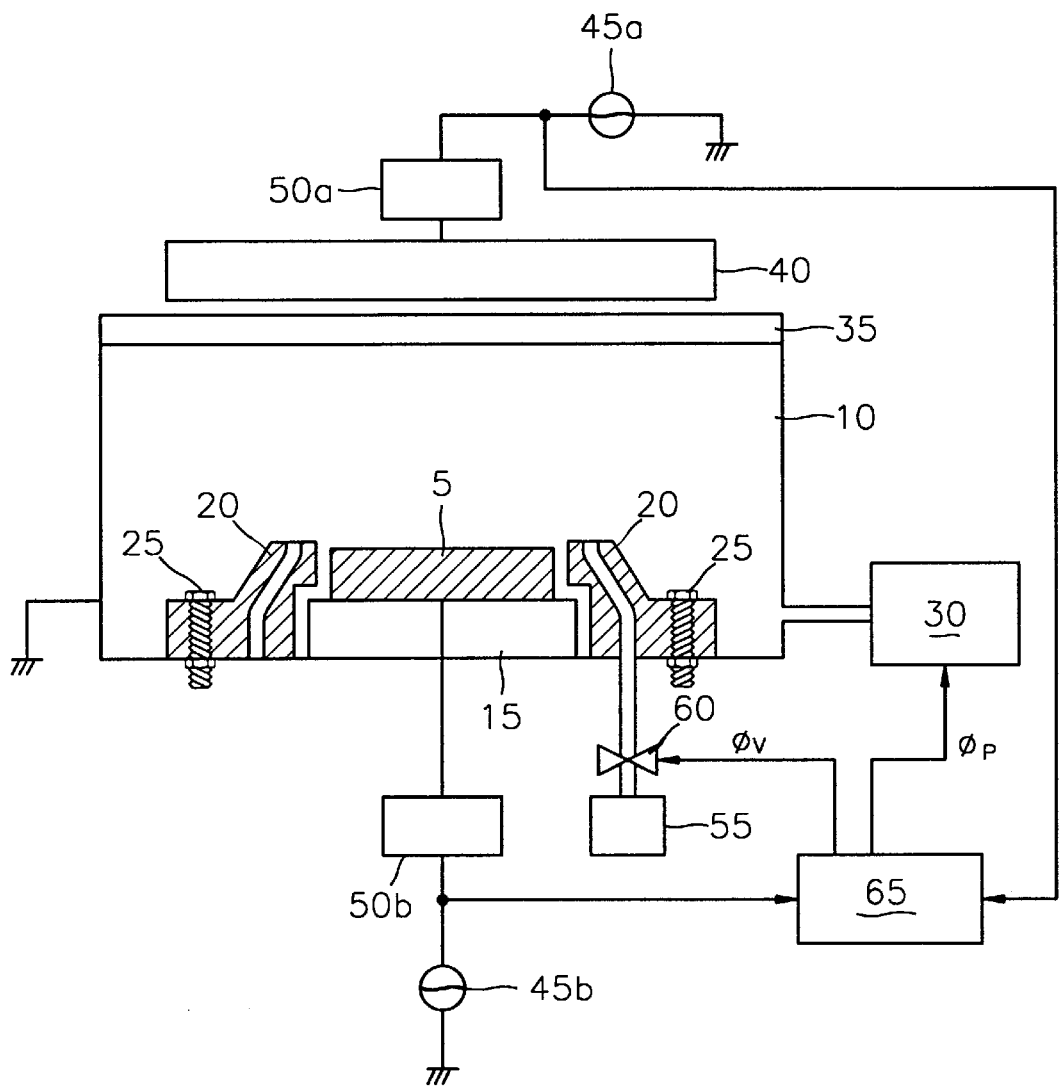
FIG. 1A is a schematic view of a conventional plasma apparatus.
Figure 1B:
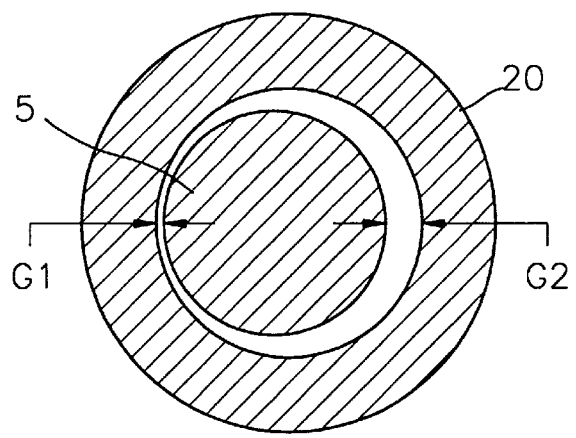
FIG. 1B is a plan view of the chuck and the gas injection ring shown in FIG. 1A.
Figure 2:
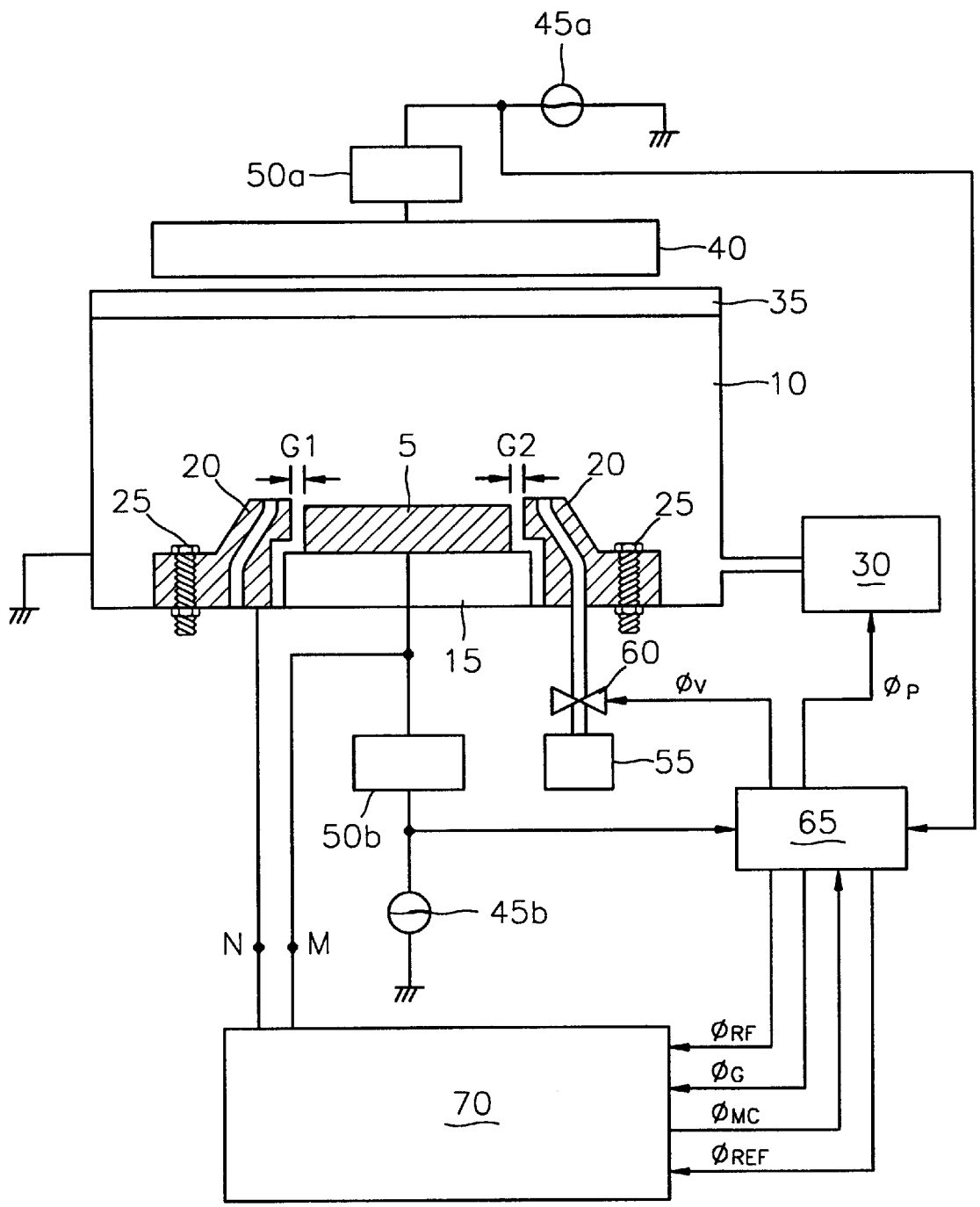
FIG. 2 is a schematic view of a plasma apparatus according to a preferred embodiment of the present invention.

FIG. 2 is a schematic of a plasma apparatus according to a preferred embodiment of the present invention. Here, the same reference characters as those of FIGS. 1A and 1B denote the same elements.

Referring to FIG. 2, a chuck 5 is installed within a chamber 10 which has an opening at the top, and the chamber 10 is grounded. A wafer on which a semiconductor device is to be formed is loaded on the chuck 5. The chuck 5 is insulated from the bottom of the chamber 10 by a chuck support 15 formed of a dielectric material. A gas injection ring 20 surrounding the chuck 5 is installed around the chuck 5. Predetermined gaps $G_1$ and $G_2$ exist between the gas injection ring 20 and the chuck 5. The gas injection ring 20 is fixed to the bottom of the chamber 10 by a fixing means 25 such as a bolt. As a result, a chuck capacitance is generated between the gas injection ring 20 and the chuck 5, i.e., between the chamber 10 and the chuck 5. The gas injection ring 20 has a gas injection passage, and a process gas is externally injected into the chamber 10 via the gas injection passage. The gas injection passage is connected to a gas tank 55 installed outside the chamber 10 through a gas inlet.

A valve 60 is installed at a predetermined position of the gas inlet, and is controlled by a valve control signal $\Phi_v$ output from a system controller 65, which controls the operation of the plasma apparatus. The bottom of the chamber 10 or a predetermined area of the sidewall of the chamber 10 is branched and connected to a vacuum pump 30, which is controlled by a pump control signal $\Phi_p$ output from the system controller 65.

The opening of the chamber 10 is covered by a cover 35 that is formed of a dielectric material. A plasma electrode 40 connected to a first plasma power source 45a is installed over the cover 35. For example, the first plasma power source 45a may be a radio frequency power source. The plasma electrode 40 is preferably formed of an induction coil or the like. It is preferable that a first radio frequency matching circuit 50a, be installed between the plasma electrode 40 and the first plasma power source 45a, so that it can maximize the transmission efficiency of plasma power generated from the first plasma power source 45a. The chuck 5 is also connected to a second plasma power source 45b, i.e., to a chuck plasma power source. The chuck plasma power source may be an induction plasma power source. The second plasma power source 45b induces plasma generated within the chamber 10 by the first plasma power source 45a over the chuck 5. A second radio frequency matching circuit 50b having the same function as that of the first radio frequency matching circuit 50a is interposed between the second plasma power source 45b and the chuck 5. The second radio frequency matching circuit 50b is preferably an induction RF matching circuit. The output ports of the first and second plasma power sources 45a and 45b are connected to the system controller 65, which detects an on/off state of the first and second plasma power sources 45a and 45b. A capacitance compensator 70 which is a characteristic element of the present invention, is connected between the chuck 5 and the chamber 10.

The capacitance compensator 70 controls the total chuck capacitance between the chuck 5 and the ground terminal using a reference signal $\Phi_{REF}$, which corresponds to an optimal total chuck capacitance applied to the system controller 65, a gas signal $\Phi_G$ for controlling a process gas injected into the chamber 10, and a plasma signal $\Phi_{RF}$. The capacitance compensator 70 measures the total chuck capacitance and transmits a signal $\Phi_{MC}$ to corresponding the measured total chuck capacitance, to the system controller 65. The system controller 65 then displays the measured total chuck capacitance.

Figure 3:
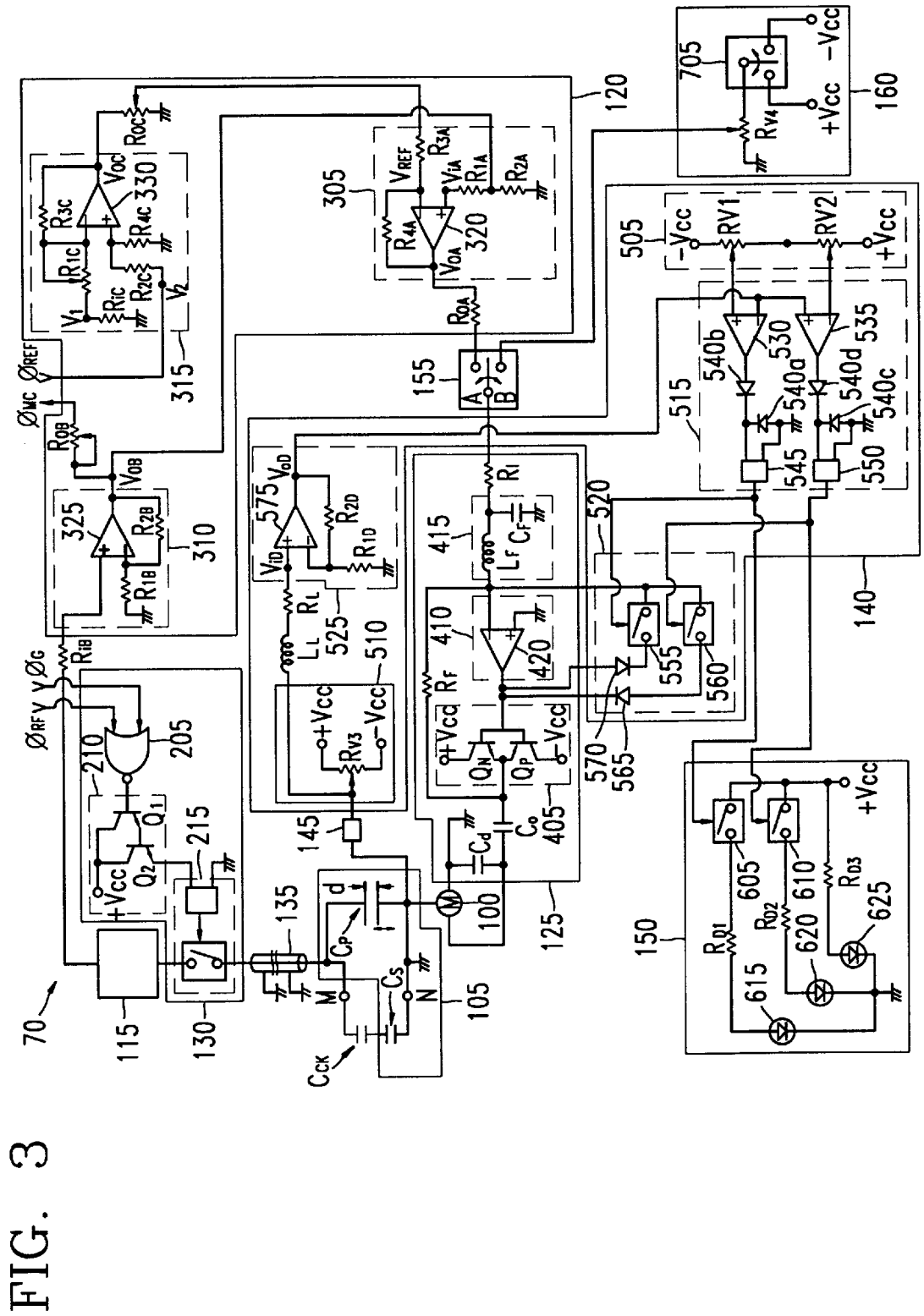
FIG. 3 is a circuit diagram of the capacitance compensator of FIG. 2.

Referring to FIG. 3, which shows a detailed circuit diagram of the capacitance compensator 70 of FIG. 2, the capacitance compensator 70 includes a variable capacitor portion 105 and a variable capacitor controller for controlling the capacitance of the variable capacitor portion 105. The variable capacitor portion 105 preferably includes at least one capacitor selected among a serial capacitor $C_S$ connected in series to a chuck capacitor $C_{CK}$, which itself comprises the chuck 5 and the gas injection ring 20, and a parallel capacitor $C_P$ connected in parallel to the combination of the serial capacitor $C_S$ and the chuck capacitor $C_{CK}$. Here, the selected capacitor $C_P$ is a variable capacitor. The serial capacitor $C_S$ in be interposed between the chuck capacitor $C_{CK}$ and a ground terminal (corresponding to a node N), or between the chuck capacitor $C_{CK}$ and the chuck 5 (corresponding to a node M). However, a variable capacitor portion 105 comprising only one parallel capacitor $C_P$, specifically, a parallel variable capacitor $C_P$, will be considered in an embodiment of the present invention to be described below, for the convenience of explanation.

Referring to FIG. 3, one electrode of the parallel variable capacitor $C_P$ is connected to the node M corresponding to the chuck 5 of FIG. 2, and the other electrode of the parallel variable capacitor $C_P$ is connected to the node N corresponding to the chamber 10 of FIG. 2. As a consequence, the parallel variable capacitor $C_P$ is connected in parallel to the chuck capacitor $C_{CK}$. In particular, it is preferable that one electrode of the parallel variable capacitor $C_P$ is fixed, and the other electrode thereof is movable. For example, it is preferable that the electrode connected to the node M is a fixed electrode, and the electrode connected to the node N is a driven, or movable, electrode.

The variable capacitor controller includes a motive power source 110, a capacitance meter 115, an automatic control signal generator 120, and a driver portion 125.

The motive power source 110 is connected to the driven electrode of the parallel variable capacitor $C_P$, and the position of the driven electrode is controlled by the motive power source 110. It is preferable that the motive power source 110 is a direct current motor including a rotational shaft. In this embodiment, the interval "d" between the driven electrode and the fixed electrode increases or decreases with respect to the direction of rotation of the rotational shaft of the direct current motor that forms the motive power source 110.

Meanwhile, the fixed electrode of the parallel variable capacitor $C_P$ is connected to the capacitance meter 115, which measures the total chuck capacitance generated between the chuck 5 of FIG. 2 and a ground terminal. Thus, the total chuck capacitance can be changed by the capacitance of the parallel variable capacitor $C_P$. The capacitance meter 115 can be an LCR meter, and preferably outputs an electrical signal, such as a voltage, corresponding to the value of the measured total chuck capacitance.

It is preferable that a process state sensor 130 be further installed between the parallel variable capacitor $C_P$ and the capacitance meter 115. The process state sensor 130 receives the plasma signal $\Phi_{RF}$ and the gas signal $\Phi_G$ from the system controller 65 of FIG. 2, and electrically connects or disconnects the fixed electrode of the parallel variable capacitor $C_P$ to the input port of the capacitance meter 115. To be more specific, it is preferable that the process state sensor 130 comprise a NOR gate 205, a switching circuit 210, and a relay switch 215. The NOR gate 205 outputs a signal corresponding to a logic "0" when at least one signal among the plasma signal $\Phi_{RF}$ and gas signal $\Phi_G$ is turned on. The switching circuit 210 generates current or generates no current, according to the output signal of the NOR gate. The relay switch 215 is interposed between the fixed electrode of the parallel variable capacitor $C_P$ and the input port of the capacitance meter 115, and is controlled by the output current of the switching circuit 210.

It is preferable that the switching circuit 210 be a darlington circuit, comprising two NPN bipolar transistors $Q_1$ and $Q_2$. However, the switching circuit can be a switching circuit other than the darlington circuit, such as, a general switching circuit comprising a MOS transistor. If a darlington circuit is used, the collectors of the two NPN bipolar transistors that form the darlington circuit are both connected to a positive power source +$V_{cc}$, and the emitter of the first NPN bipolar transistor $Q_1$ is connected to the base of the second NPN bipolar transistor $Q_2$. The base of the first NPN bipolar transistor $Q_1$ is then the input port of the switching circuit 210, and is connected to the output port of the NOR gate. The emitter of the second NPN bipolar transistor $Q_2$ is the output port of the switching circuit 210. Thus, when at least one of the plasma power sources 45a and 45b (see FIG. 2) is turned on or a process gas is injected into the chamber 10, the NOR gate outputs a signal corresponding to a logic "0," and no current flows between the positive power source +$V_{cc}$ and the emitter of the second NPN bipolar transistor $Q_2$. Consequently, at this time the relay switch 215 is turned off, so that the parallel variable capacitor $C_P$ and the capacitance meter 115 are electrically disconnected from each other. Conversely, when both the plasma power sources 45a and 45b are turned off and no process gases are injected into the chamber, the relay switch 215 is turned on, so that the parallel variable capacitor $C_P$ and the capacitance meter 115 are electrically connected to each other. As a result, the capacitance meter 115 measures the total chuck capacitance only when a process is not performed.

As described above, it is preferable that the process state sensor 130 be designed so as to disconnect the chuck 5 from the capacitance meter 115 while a predetermined process is being performed within the chamber 10. This is because the total chuck capacitance cannot be accurately measured due to plasma power applied to the chuck 5 or a process gas injected into the chamber 10 while a predetermined process is performed within the chamber 10.

Also, the fixed electrode of the parallel variable capacitor $C_P$ and the input port of the capacitance meter 115 are preferably connected to a coaxial cable 135 having excellent noise immunity.

The automatic control signal generator 120 preferably includes an analog comparator 305 for amplifying the difference between the output signal of the capacitance meter 115 and the reference signal $\Phi_{REF}$ output from the system controller 65, and for outputting the resultant compared signal. Here, the reference signal $\Phi_{REF}$ corresponds to an optimal total chuck capacitance that an operator inputs to the system controller 65.

The analog comparator 305 can include an operational amplifier 320 having an inverting input terminal (−) and a non-inverting input terminal (+). First and second resistors $R_{1A}$ and $R_{2A}$ are connected in series to each other between the non-inverting input terminal (+) of the operational amplifier 320 and a ground terminal, and a third resistor $R_{3A}$ is interposed between the inverting input terminal (−) of the operational amplifier 320 and the reference signal ($\Phi_{REF}$) output terminal of the system controller 65. A fourth resistor $R_{4A}$ is interposed between the inverting input terminal (−) of the operational amplifier 320 and the output terminal of the operational amplifier 320, and a node between the first and second resistors $R_{1A}$ and $R_{2A}$ is connected to the output terminal of the capacitance meter 115. Accordingly, the output terminal of the operational amplifier 320 shows an output voltage $V_{oA}$ corresponding to the voltage difference between a reference voltage $V_{REF}$ applied to the inverting input terminal (−) and an input voltage $V_{iA}$ applied to the non-inverting input terminal (+). When the input voltage $V_{iA}$ is lower than the reference voltage $V_{REF}$, the output voltage $V_{oA}$ of the operational amplifier 320 is negative. Conversely, when the input voltage $V_{iA}$ is higher than the reference voltage $V_{REF}$, the output voltage $V_{oA}$ of the operational amplifier 320 is positive. In this circuit, the first through fourth resistors $R_{1A}$, $R_{2A}$, $R_{3A}$ and $R_{4A}$ are used to appropriately adjust the voltage gain of the analog comparator 305.

Preferably, the automatic control signal generator 120 further includes a first amplifier 310 interposed between the output terminal of the capacitance meter 115 and the non-inverting input terminal (+) of the analog comparator 305, and a second amplifier 315 interposed between the reference signal ($\Phi_{REF}$) output terminal of the system controller 65 and the inverting input terminal (−) of the analog comparator 305. The first and second amplifiers 310 and 315 act as voltage controllers for applying an appropriate voltage level to the non-inverting input terminal (+) and inverting input terminal (−) of the analog comparator 305. For example, when the optimal total chuck capacitance input to the system controller 65 is consistent with the total chuck capacitance measured by the capacitance meter 115, voltages applied to the non-inverting input terminal (+) and inverting input terminal (−) of the analog comparator 305 must be the same. Thus, it is preferable that the first and second amplifiers 310 and 315 are further included in the automatic control signal generator 120.

Preferably, both the first and second amplifiers 310 and 315 can include operational amplifiers. However, the first and second amplifiers 310 and 315 can also be formed as other amplifiers that do not use operational amplifiers. To be more specific, the first amplifier 310 preferably includes an operational amplifier 325, a first resistor $R_{1B}$ interposed between the inverting input terminal (−) of the operational amplifier 325 and a ground terminal, and a second resistor $R_{2B}$ interposed between the inverting input terminal (−) and the output terminal of the operational amplifier 325. The non-inverting input terminal (+) of the operational amplifier 325 is connected to the output terminal of the capacitance meter 115. Thus, the voltage gain of the first amplifier 310 can be expressed as $(R_{1B}+R_{2B})/R_{1B}$. An input resistor $R_{iB}$ can be interposed between the non-inverting input terminal (+) of the first amplifier 310 and the capacitance meter 115.

The output signal of the first amplifier 310, i.e., an amplified signal $\Phi_{MC}$ with respect to the measured total chuck capacitance, can be transmitted to the system controller 65. As a result, the system controller 65 converts the total chuck capacitance measured by the capacitance meter 115 into a decimal number so that the total chuck capacitance may be visually detected by an operator. Here, an output resistor $R_{oB}$ such as a variable resistor can be further interposed between the output terminal of the first amplifier 310 and the system controller 65. Both the input resistors $R_{iB}$ and the output resistor $R_{oB}$ of the first amplifier 310 are used for the purpose of appropriately controlling an analog signal measured by the capacitance meter 115.

The second amplifier 315 preferably includes an operational amplifier 330, a first resistor $R_{1C}$ and an input resistor $R_{iC}$ sequentially connected to each other in series between the inverting input terminal (−) of the operational amplifier 330 and a ground terminal, a second resistor $R_{2C}$ interposed between the non-inverting input terminal (+) of the operational amplifier 330 and the reference signal ($\Phi_{REF}$) output terminal of the system controller 65, a third resistor $R_{3C}$ interposed between the inverting input terminal (−) and the output terminal of the operational amplifier 330, and a fourth resistor $R_{4C}$ interposed between the non-inverting input terminal (+) of the operational amplifier 330 and a ground terminal. It is preferable that one resistor among the first through fourth resistors, e.g., the first resistor $R_{1C}$, be a variable resistor, since the offset value of the operational amplifier 330 can be minimized when the parallel resistance value of the first and second resistors is made equal to that of the third and fourth resistors by appropriately controlling the first variable resistor $R_{1C}$. Here, the output voltage $V_{oc}$ of the second amplifier 315 can be expressed as $R_{2C}(V_2-V_1)/R_{1C}$, where $V_1$ denotes a node voltage between the input resistor $R_{iC}$ and the first resistor $R_{1C}$ and $V_2$ denotes the total voltage induced in the second and fourth resistors $R_{2C}$ and $R_{4C}$. A variable output resistor $R_{oC}$ can be installed between the output terminal of the second amplifier 315 and the analog comparator 305. Thus, voltages applied to the input terminals of the analog comparator 305 can be more precisely controlled by appropriately adjusting the output resistor $R_{oC}$ of the second amplifier 315. Also, an output resistor $R_{oA}$ can be further included in the output terminal of the analog comparator 305.

The output signal of the automatic control signal generator 120 is preferably amplified by the driver portion 125, and the signal amplified by the driver portion 125 drives the motive power source 110.

The driver portion 125 preferably includes an amplification stage 405 for amplifying the output signal of the automatic control signal generator 120, and a driving capacitor $C_d$ interposed between the output port of the amplification stage 405 and a ground terminal. The driving capacitor $C_d$ is connected in parallel to the power source terminals of the motive power source 110, and removes a noise signal input to the power source terminal of the motive power source 110. Thus, the driving capacitor $C_d$ operates to stably drive the motive power source 110, which is preferably a direct current motor. The rotating direction of the rotational shaft of the direct current motor depends on the polarity of a signal output by the amplification stage 405. For example, if the rotating shaft of the direct current motor rotates clockwise while the output port of the amplification stage 405 has a positive voltage, the rotating shaft of the direct current motor rotates counterclockwise while the output port of the amplification stage 405 has a negative voltage. A predetermined power transmitting means for changing the rotational movement into linear movement is interposed between the rotating shaft of the direct current motor and the driven electrode of the parallel variable capacitor $C_P$, such that the driven electrode of the parallel variable capacitor $C_P$ is moved.

For example, the power transmitting means can be a cylindrical tube having a spiral groove formed on its inner surface. In this case, a spiral groove to be meshed with the spiral groove formed on the inner surface of the tube is formed on the outer surface of the rotating shaft of the direct current motor. When the rotating shaft of the direct current motor is coupled to fit into the tube, the interval between the electrodes of the parallel variable capacitor $C_P$ increases or decreases according to the direction of rotation of the rotational shaft.

Preferably, the amplification stage 405 is a push-pull amplifier including an NPN bipolar transistor $Q_N$ and a PNP bipolar transistor $Q_P$ connected to each other in series between the positive and negative power sources ($+V_{cc}$) and ($-V_{cc}$). The base electrode of the NPN bipolar transistor $Q_N$ and the base electrode of the PNP bipolar transistor $Q_P$ are connected to each other and act as the input terminal of a push-pull amplifier. The emitter electrodes of the complementary bipolar transistors are connected to each other and act as the output terminal of a push-pull amplifier. When a positive voltage is applied to the input terminal of the push-pull amplifier, the NPN bipolar transistor $Q_N$ connected to the positive power source $+V_{cc}$ is turned on, so that an amplified positive voltage is induced at the output terminal. On the other hand, when a negative voltage is applied to the input terminal of the push-pull amplifier, the PNP bipolar transistor $Q_P$ connected to the negative power source $-V_{cc}$ is turned on, so that an amplified negative voltage is induced at the output terminal. Accordingly, the capacitance of the parallel variable capacitor $C_P$ increases or decreases according to the polarity and level of the voltage applied to the input terminal of the amplification stage. Also, an output capacitor $C_o$ can be further included between the push-pull amplifier and the driving capacitor $C_d$. The output capacitor $C_o$ operates to remove a noise signal from the output signal of the push-pull amplifier and also operates to more stably drive the motive power source 110, when it is a direct current motor.

The driver portion 125 can further include an inverter 410 between the amplication stage 405 and the automatic control signal generator 120. The inverter 410 preferably comprises an operational amplifier 420. The driver portion 125 can further include a feed-back resistor $R_F$ interposed between the input terminal of the inverter 410 and the output port of the amplication stage 405. The feed-back resistor $R_F$ stably drives the amplication stage 405. The driver portion 125 can further include a noise filter 415, which allows only a direct current signal to pass from the automatic control signal generator 120 to the inverter 410. The noise filter 415 preferably comprises a filter capacitor $C_F$ interposed between the output port of the automatic control signal generator 120 and a ground terminal, and a filter inductor $L_F$ interposed between the output port of the automatic control signal generator 120 and the input port of the inverter 410. The driver portion 125 can further include an input resistor $R_I$ between the noise filter 415 and the automatic control signal generator 120. The input resistor $R_I$ in the driver portion 125 prevents the input signal of the driver portion 125 from abruptly changing, by delaying the output signal of the automatic control signal generator 120 for a predetermined time.

As described above, the capacitance compensator 70 in the plasma apparatus according to the preferred embodiment of present invention drives the motive power source 110 until the total chuck capacitance of the plasma apparatus is consistent with the optimal total chuck capacitance, whenever a process is not performed, and controls the capacitance of the parallel variable capacitor $C_P$. Thus, the total chuck capacitance can be kept at a constant value without periodic pre-maintenance.

The variable capacitor controller can further include a limit control portion 140 for ensuring so that the driven electrode of the parallel variable capacitor $C_P$ moves only within a predetermined range.

The limit control portion 140 includes a voltage limit setting portion 505, a limit sensor 510, a digital comparator 515, and a connector 520. The voltage limit setting portion 505 generates a desired negative voltage limit and a desired positive voltage limit. The limit sensor 510 generates a voltage corresponding to the actual position of the driven electrode of the parallel variable capacitor $C_P$. The digital comparator 515 compares the output voltage of the limit sensor 510 with limit voltages set by the voltage limit setting portion 505, and outputs first and second signals via first and second output terminals, respectively. The connector 520 is controlled by the first or second signal of the digital comparator 515, and electrically connects the input and output terminals of the inverter 410 in the driver portion 125 to each other.

The voltage limit setting portion 505 preferably includes first and second variable resistors $R_{V1}$ and $R_{V2}$ connected to each other in series between the negative and positive power sources $-V_{cc}$ and $+V_{cc}$. Thus, a desired negative voltage limit can be obtained at a variable terminal of the first variable resistor $R_{V1}$ by appropriately controlling the variable terminal of the first variable resistor $R_{V1}$ connected to the negative power source $-V_{cc}$. Similarly, a desired positive voltage limit can be obtained at a variable terminal of the second variable resistor $R_{V2}$.

The limit sensor 510 preferably includes a variable resistor $R_{V3}$ interposed between the negative and positive power sources $-V_{cc}$ and $+V_{cc}$. The variable terminal of the variable resistor $R_{V3}$ is mechanically connected to the driven electrode of the parallel variable capacitor $C_P$ and moves together with the driven electrode. An insulator 145 is preferably interposed between the variable terminal of the variable resistor $R_{V3}$ and the driven electrode to electrically insulate them from each other. Accordingly, when the driven electrode moves, the voltage of the variable terminal of the variable resistor $R_{V3}$ also changes. As a consequence, a voltage corresponding to the position of the driven electrode can be obtained at the variable terminal of the variable resistor $R_{V3}$. The variable terminal of the variable resistor $R_{V3}$ corresponds to the output terminal of the limit sensor 510.

The digital comparator 515 preferably comprises first and second comparators 530 and 535, first through fourth diodes 540a–540d, and first and second induction coils 545 and 550. The first comparator 530 outputs a positive voltage only when the output voltage of the limit sensor 510 is lower than the voltage of the variable terminal of the first variable resistor $R_{V1}$ included in the limit setting portion 505. The second comparator 535 outputs a positive voltage only when the output voltage of the limit sensor 510 is higher than the voltage of the variable terminal of the second variable resistor $R_{V2}$ included in the limit setting portion 505. The first and second diodes 540a and 540b are connected to each other in series between the output terminal of the first comparator 530 and a ground terminal. Similarly, the third and fourth diodes 540c and 540d are connected to each other in series between the output terminal of the second comparator 535 and a ground terminal.

The P-type electrodes of the first and second diodes 540a and 540b are connected directly to the output terminal of the first comparator 530 and the ground terminal, respectively. Similarly, the P-type electrodes of the third and fourth diodes 540c and 540d are connected directly to the output terminal of the second comparator 535 and the ground terminal, respectively.

The first diode 540a is connected in parallel to the first induction coil 545, and the third diode 540c is connected in parallel to the second induction coil 550. Thus, when the output voltage of the limit sensor 510 is lower than the negative voltage limit due to excessive movement of the driven electrode of the parallel variable capacitor $C_P$, a first signal, i.e., a first current, flows only in the first induction coil 545. Similarly, when the output voltage of the limit sensor 510 is higher than the positive voltage limit due to excessive movement of the driven electrode of the parallel variable capacitor $C_P$, a second signal, i.e., a second current, flows only in the second induction coil 550.

The connector 520 includes a first relay switch 555 controlled by the first current flowing in the first induction coil 545, a second relay switch 560 controlled by the second current flowing in the second induction coil 550, a first rectifying device 565, e.g., a first diode interposed between one end of the first relay switch 555 and the output terminal of the inverter 410 included in the driver portion 125, and a second rectifying device 570, e.g., a second diode interposed between one end of the second relay switch 560 and the output terminal of the inverter 410 included in the driver portion 125. The other end of each of the first and second relay switches 555 and 560 is connected to the input port of the inverter 410.

Thus, when the output voltage of the limit sensor 510 is lower than the negative voltage limit, a current is induced in the first induction coil 545, causing the first relay switch 555 to turn on. The output voltage of the inverter 410 included in the driver portion 125 is thus inverted. As a consequence, the rotating direction of the motive power source 110 is changed, so that the output voltage of the limit sensor 510 becomes higher than the negative voltage limit. Conversely, when the output voltage of the limit sensor 510 is higher than the positive voltage limit, a current is induced in the second induction coil 550, causing the second relay switch 560 to turn on. The output voltage of the inverter 410 included in the driver portion 125 is thus inverted. As a consequence, the rotating direction of the motive power source 110 is changed, so that the output voltage of the limit sensor 510 becomes lower than the positive voltage limit.

The limit control portion 140 can further include an amplifier 525 between the limit sensor 510 and the digital comparator 515. The amplifier 525 preferably has the same configuration and function as the first amplifier 310 in the automatic control signal generator 120. The amplifier 525 may include an operational amplifier 575 and first and second resistors $R_{1D}$ and $R_{2D}$. In addition, the limit control portion 140 can further include an inductor $L_L$ and a resistor $R_L$ connected in series to each other between the limit sensor 510 and the amplifier 525, to remove a noise signal generated by the limit sensor 510.

As described above, the limit control portion 140 limits the range within which the driven electrode of the parallel variable capacitor $C_P$ may move. This can prevent a collision of the driven electrode of the parallel variable capacitor $C_P$ with the fixed electrode by appropriate control of the first and second variable resistors $R_{V1}$ and $R_{V2}$ in the voltage limit setting portion 505.

Meanwhile, the variable capacitor controller can further comprise a limit display portion 150, which is controlled by the output signal of the digital comparator 515 included in the limit control portion 140. The limit display portion 150 generates a signal that allows an operator to visually detect when the driven electrode is situated outside of an allowable range.

The limit display portion 150 preferably includes first and second relay switches 605 and 610 and at least two light emitting devices 615 and 620. Preferably, the light emitting device is a light emitting diode. The first relay switch 605 and the first light emitting device 615 are connected to each other in series between the positive power source $+V_{cc}$ and a ground terminal, and the second relay switch 610 and the second light emitting device 620 are also connected to each other in series between the positive power source $+V_{cc}$ and a ground terminal. The first relay switch 605 is controlled by the first induction coil 545 included in the limit control portion 140, and the second relay switch 610 is controlled by the second induction coil 550 included in the limit control portion 140. It is preferable that a resistor $R_{D1}$ is interposed between the first relay switch 605 and the first light emitting device 615 to prevent excess current from flowing into the first light emitting device 615 when the first relay switch 605 is turned on. Similarly, it is preferable that a resistor $R_{D2}$ is also interposed between the second relay switch 610 and the second light emitting device 620. A third light emitting device 625 and a resistor $R_{D3}$ connected to each other in series may be further included between the positive power source $+V_{cc}$ and a ground terminal, so that the general operation of the capacitance compensator 70 can be visually detected. Thus, when the limit control portion 140 is further included, an operator may be visually informed when the driven electrode of the parallel variable capacitor $C_P$ is outside the predetermined range.

The variable capacitor controller preferably further includes a selection switch 155 interposed between the driver portion 125 and the automatic control signal generator 120, and a manual control signal generator 160 connected to the selection switch 155.

The selection switch 155 operates to select an automatic mode or a manual mode, and preferably has three terminals. One terminal of the selection switch 155 is connected to the input terminal of the driver portion 125; another terminal of the selection switch 155 is connected to the output terminal of the automatic control signal generator 120; and the third terminal of the selection switch 155 is connected to the output terminal of the manual control signal 160. Accordingly, as shown in FIG. 3, the capacitance compensator 70 operates in the automatic mode when the selection switch 155 is switched in a direction "A," and operates in the manual mode when the selection switch 155 is switched in a direction "B."

The manual control signal generator 160 includes a variable resistor $R_{v4}$ and a power switch 705. The ends of the variable resistor $R_{v4}$ are respectively connected to a ground terminal and the power switch 705, and the variable terminal of the variable resistor $R_{v4}$ is connected to the selection switch 155. The power switch 705 selects either a positive power source $+V_{cc}$ or a negative power source $-V_{cc}$. Accordingly, the capacitance of the parallel variable capacitor $C_P$ can be decreased (or increased) by switching the mode of the selection switch 155 into a manual mode, connecting the power switch 705 to the positive power source $+V_{cc}$, and appropriately controlling the variable terminal of the variable resistor $R_{v4}$. Similarly, the capacitance of the parallel variable capacitor $C_P$ can be increased (or decreased) by switching the mode of the selection switch 155 into a manual mode, connecting the power switch 705 to the negative power source $-V_{cc}$, and appropriately controlling the variable terminal of the variable resistor $R_{v4}$.

Figure 4A:
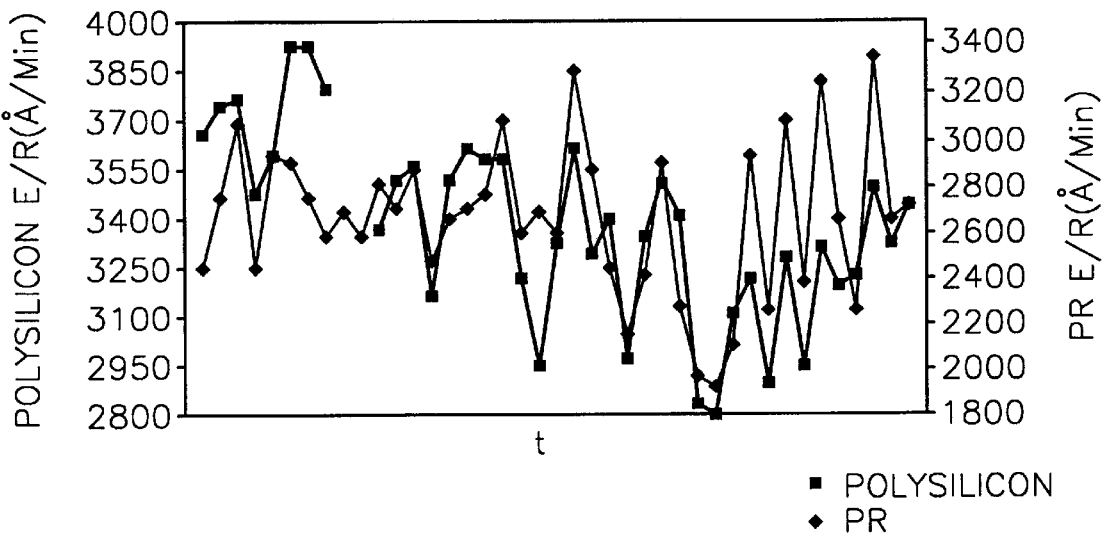
FIG. 4A is a graph showing the etch rates of a polysilicon film and a photoresist film obtained when a conventional plasma apparatus is used.
Figure 4B:
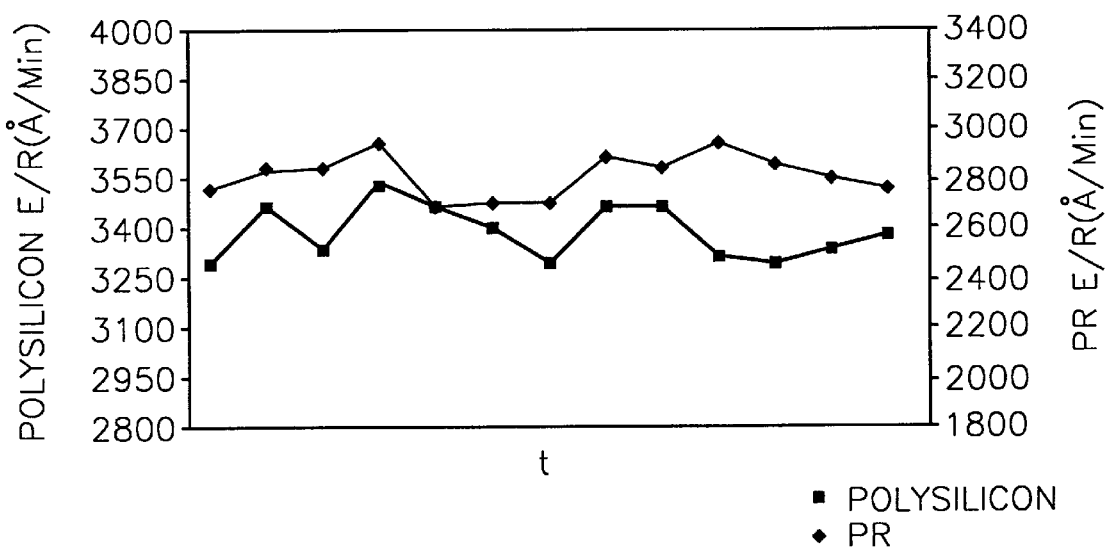
FIG. 4B is a graph showing the etch rates of a polysilicon film and a photoresist film obtained when a plasma apparatus according to a preferred embodiment of the present invention is used.

FIG. 4A is a graph showing the etch rate of a polysilicon film and that of a photoresist film when a conventional plasma apparatus is used. FIG. 4B is a graph showing the etch rate of a polysilicon film and that of a photoresist film when a plasma apparatus according to a preferred embodiment of the present invention is applied. Here, the etch rate of the photoresist film was obtained by applying the same etching recipe as that used for etching the polysilicon film. In FIGS. 4A and 4B, the horizontal axis denotes time (t), and the two vertical axes on the left and right denote the etch rate of the polysilicon film and that of the photoresist film, respectively. Data in FIG. 4A shows etch rates measured continuously for about 60 days, and data in FIG. 4B shows etch rates measured continuously for about 20 days. The polysilicon film etching recipe applied in the present invention was the same as the polysilicon film etching method applied in the prior art.

Referring to FIGS. 4A, the etch rate of the polysilicon film ranged from 2800 Å/min to 3900 Å/min when a conventional plasma etching apparatus was used. However, as shown in FIG. 4B, when a plasma etching apparatus according to a preferred embodiment of the present invention was used, the etch rate of the polysilicon film showed uniform values of about 3250 Å/min to 3350 Å/min. Also, when a photoresist film was etched using the conventional plasma etching apparatus, the etch rate of the photoresist film ranged from 1900 Å/min to 3400 Å/min. In comparison, when a photoresist film was etched using the plasma etching apparatus according to the present invention, the etching rate of the photoresist film showed uniform values ranging from 2700 Å/min to 3000 Å/min.

Figure 5:
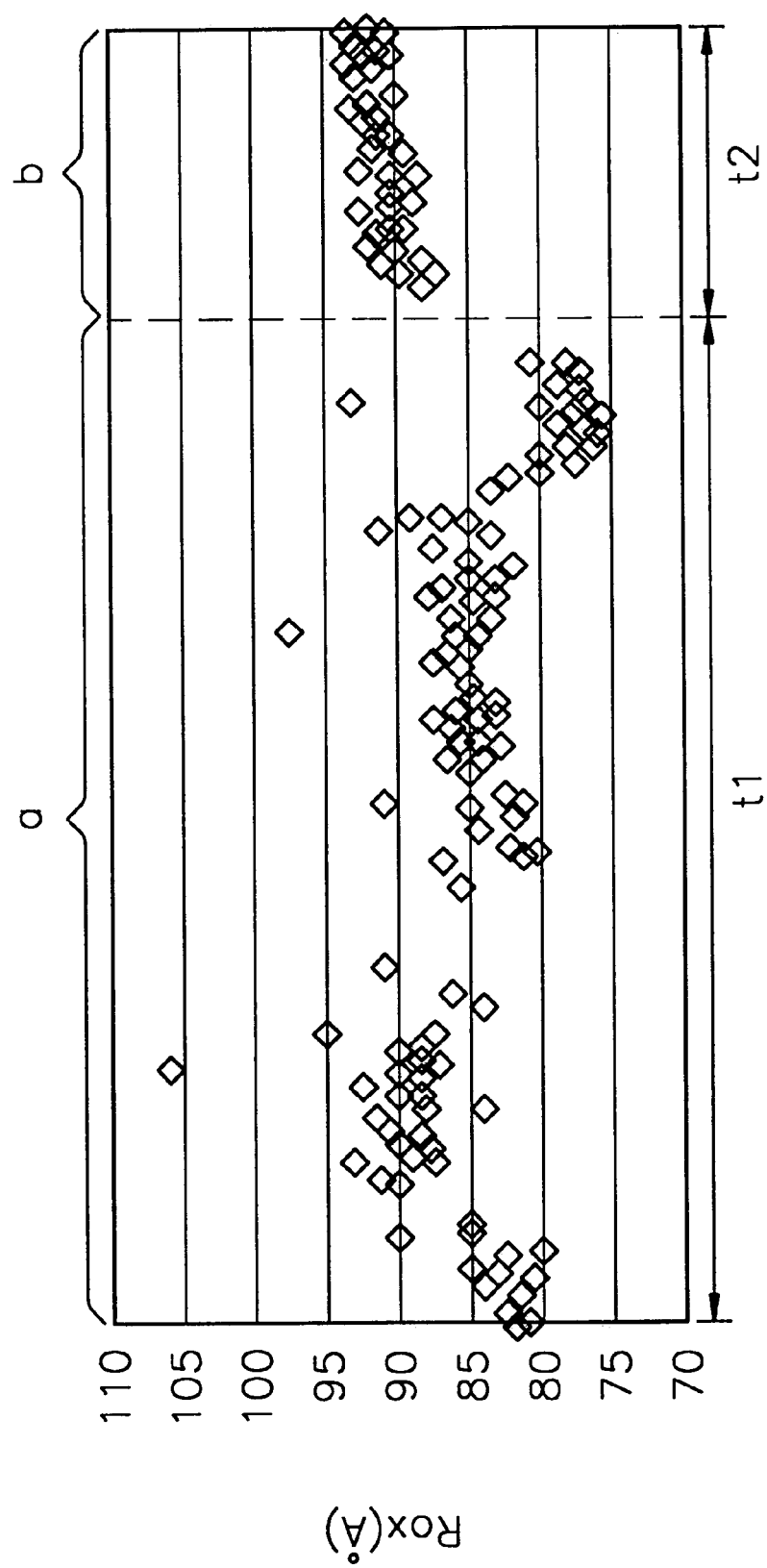
FIG. 5 is a graph showing the measured values of the thickness of a residual oxide layer when a conventional plasma apparatus and a plasma apparatus according to a preferred embodiment of the present invention are used, respectively.

FIG. 5 is a graph showing variations in the thickness of a residual oxide layer remaining after a gate polysilicon film was etched using a conventional plasma etching apparatus and a plasma etching apparatus according to a preferred embodiment of the present invention. Here, an initial gate oxide film was formed to a thickness of 110 Å to 120Å, and a 1000 Å gate polysilicon film was formed on the initial gate oxide film. In FIG. 5, the horizontal axis denotes time t1 and t2, the vertical axis denotes the thickness $R_{ox}$ of a residual oxide film, and portions (a) and (b) denote the conventional design and the present invention, respectively. Data for the conventional design shows results measured for 30 days, while data for the present invention shows results measured for 10 days.

Referring to FIG. 5, the thickness $R_{ox}$ of a residual oxide film in the conventional design ranged from 75 Å to 105Å, while the thickness $R_{ox}$ of a residual oxide film in the present invention showed much more uniform values, ranging from 87 Å to 94 Å.

Figure 6:
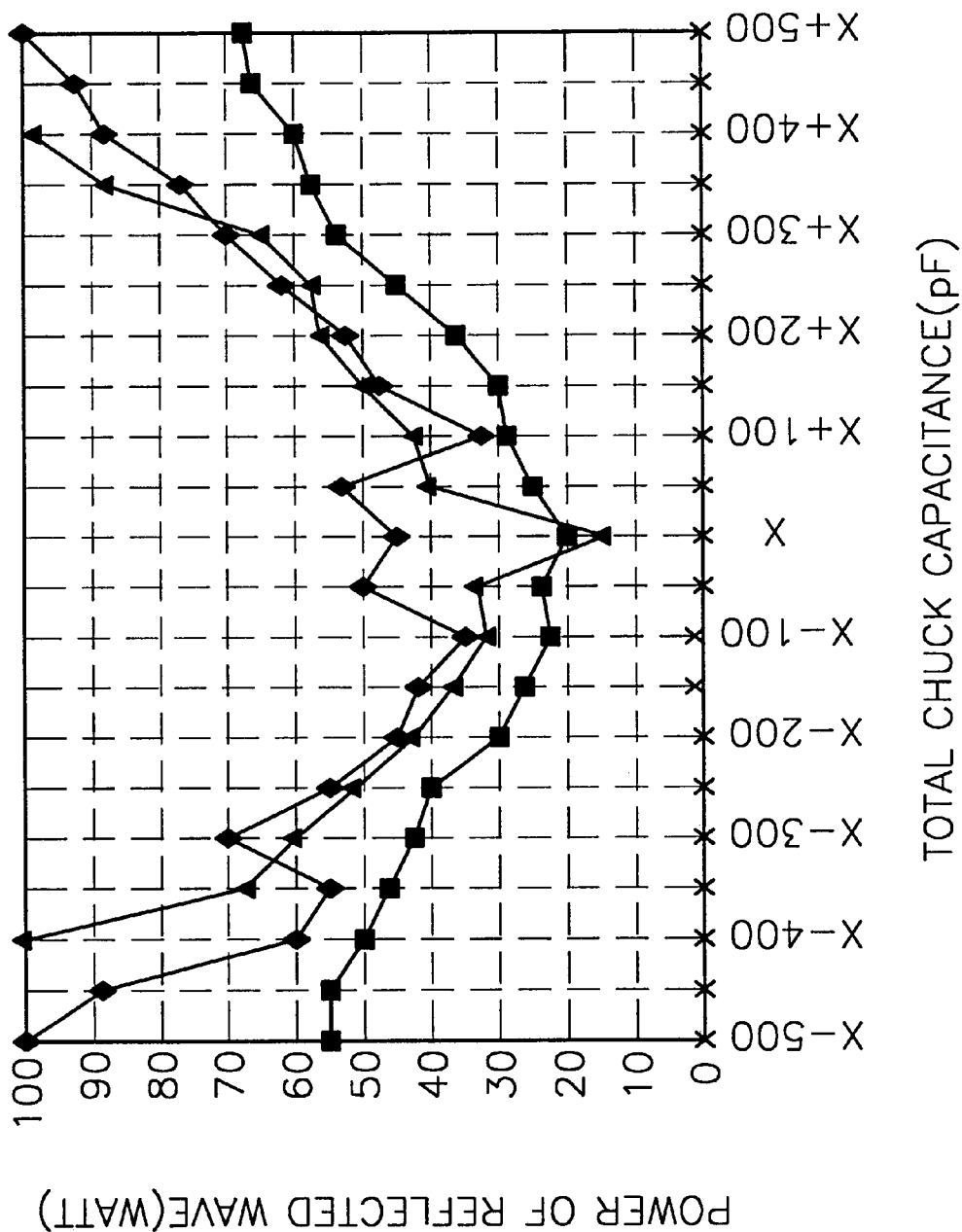
FIG. 6 is a graph showing the measured results of a reflected wave with respect to the output signal of an induction plasma power source connected to a chuck according to the installation position of the capacitance compensator of FIG. 3.

FIG. 6 is a graph showing the measured results of the power of a reflected wave with respect to the output signal of the second plasma power source 45b according to the installation position of the capacitance compensator 70 of FIG. 3. In FIG. 6, the horizontal axis denotes the total chuck capacitance between a chuck and a ground terminal, and the vertical axis denotes the power of a reflected wave with respect to the output signal of the second plasma power source 45b. The center value (X) of the total chuck capacitance was 1000 pF. Accordingly, the powers of the reflected wave shown in FIG. 6 are measured values when the total chuck capacitance changes between 500 pF and 1500 pF. In FIG. 6, data indicated by "x" and "♦" corresponds to the power of reflected waves measured when the capacitance compensator 70 is installed under the chamber 10 and over the chamber 10, respectively, and data indicated by "■" and "▲" corresponds to the power of reflected waves measured when the capacitance compensator 70 is installed on the left and the right sides of the chamber 10, respectively. In this case, the second radio frequency matching circuit 50b connected to the chuck 5, e.g., the induction RF matching circuit, was installed at a position closest to the chuck 5, that is, under the chamber 10.

Referring to FIG. 6, when the capacitance compensator 70 was installed over the chamber 10 or on the right or left side of the chamber 10, the reflected wave of an RF signal output by the second plasma power source 45b greatly changed with a variation of the total chuck capacitance. On the other hand, when the capacitance compensator 70 was installed under the chamber 10, the reflected wave of an RF signal output from the second plasma power source 45b had small changes regardless of a variation in the total chuck capacitance.

When the reflected wave is generated, a plasma process is unstable, so that the uniformity of a process parameter such as an etch rate or a deposition rate is degraded. Accordingly, when the capacitance compensator 70 is installed under the chamber 10, that is, close to the second RF matching circuit 50b, a stable plasma process can be performed even when the desired optimal total chuck capacitance is changed within a predetermined range. Thus, it is most preferable that the capacitance compensator 70 be installed close to the second RF matching circuit 50b. Also, it is preferable that the output port of the second RF matching circuit 50b be connected to the variable capacitor $C_P$ in the capacitance compensator 70 via a coaxial cable 135, and that the coaxial cable 135 is as short as possible. It is also preferable that the capacitance compensator 70 including the coaxial cable 135 be built in the second RF matching circuit 50b to ensure an operator's safety and to save space.

According to the present invention as described above, the total chuck capacitance between a chuck and a ground terminal can be controlled so that it is always consistent with a desired optimal total chuck capacitance. As a result, the uniformity of a plasma process can be improved. Also, in the present invention, precise manual adjustment of the gap between a chuck and a gas injection ring is not required during pre-maintenance. Therefore, the time required for pre-maintenance is significantly reduced.

Although the invention has been described with reference to a particular embodiment, it will be apparent to one of ordinary skill in the art that modifications of the described embodiment may be made without departing from the spirit and scope of the invention.

What is claimed is:

1. A plasma apparatus, comprising: performed;
- a chuck mounted in the chamber and insulated from the chamber;
- a chuck plasma power source connected to the chuck;
- a system controller for outputting a signal for controlling the chuck plasma power source; and
- a capacitance compensator for keeping the total chuck capacitance between the chuck and a ground terminal at a constant value,
- wherein the capacitance compensator comprises:
  - a variable capacitor portion connected between the chuck and the ground terminal and comprising at least one variable capacitor; and
  - a variable capacitor controller for controlling the capacitance of the variable capacitor,
- wherein the variable capacitor controller comprises:
  - a motive power source for changing a gap between electrodes of the variable capacitor;
  - a capacitance meter for measuring the total chuck capacitance between the chuck and the ground terminal and outputting an electrical signal corresponding to the measured total chuck capacitance;
  - an automatic control signal generator for outputting an electrical signal corresponding to the difference between the output signal of the capacitance meter and a reference signal that corresponds to an optimal total chuck capacitance input to the system controller; and
  - a driver portion for driving the motive power source by amplifying the output signal of the automatic control signal generator.

2. A plasma apparatus, as recited in claim 1, wherein the motive power source is a direct current motor including a rotational shaft, and the gap between the electrodes of the variable capacitor increases or decreases according to the direction of rotation of the rotational shaft.

3. A plasma apparatus, as recited in claim 1, wherein the automatic control signal generator includes a comparator.

4. A plasma apparatus, as recited in claim 3, wherein the automatic control signal generator comprises:
- a first amplifier interposed between the capacitance meter and the comparator for amplifying the output signal of the capacitance meter; and
- a second amplifier interposed between the system controller and the comparator for amplifying the reference signal output by the system controller.

5. A plasma apparatus, as recited in claim 1, wherein the driver portion comprises:
- an amplification stage connected to the output port of the automatic control signal generator; and
- a driving capacitor interposed between the output port of the amplification stage and the ground terminal and connected in parallel to the motive power source.

6. A plasma apparatus, as recited in claim 5, wherein the amplification stage is a power amplifier.

7. A plasma apparatus, as recited in claim 6, wherein the power amplifier is a push-pull amplification stage comprising an NPN bipolar transistor and a PNP bipolar transistor connected in series between positive and negative power sources.

8. A plasma apparatus, as recited in claim 5, further comprising an inverter interposed between the output port of the automatic control signal generator and the input port of the amplification stage.

9. A plasma apparatus, as recited in claim 8, further comprising a limit control portion for limiting the range within which a driven electrode among the electrodes of the variable capacitor is moved by the motive power source.

10. A plasma apparatus, as recited in claim 9, wherein the limit control portion comprises:
- a voltage limit setting portion for setting a negative voltage limit and a positive voltage limit;
- a limit sensor for outputting a predetermined voltage between the positive and negative power sources according to the position of the driven electrode of the variable capacitor;
- a digital comparator having a first output port for outputting a first signal when the output voltage of the limit sensor is lower than the negative voltage limit and a second output port for outputting a second signal when the output voltage of the limit sensor is higher than the positive voltage limit;
- a first rectifying device for allowing only a forward current to flow from the output port of the inverter to the input port of the inverter;
- a second rectifying device for allowing only a forward current to flow from the input port of the inverter to the output port of the inverter;
- a first switch interposed between the first rectifying device and the input port of the inverter and being controlled by the first signal of the first output port of the digital comparator; and
- a second switch interposed between the second rectifying device and the input port of the inverter and controlled by the second signal of the second output port of the digital comparator.

11. A plasma apparatus, as recited in claim 1, further comprising:
- a selection switch interposed between the automatic control signal generator and the driver portion; and
- a manual control signal generator connected to the selection switch,
- wherein the selection switch connects the driver portion to one of the automatic control signal generator or the manual control signal generator.

12. A plasma apparatus, as recited in claim 11, wherein the manual control signal generator comprises:
- a power switch for selecting either the positive power source or the negative power source; and
- a variable resistor interposed between the power switch and the ground terminal, the variable resistor having a variable terminal connected to the selection switch.

13. A plasma apparatus, comprising:
- a grounded chamber having a space where a predetermined process may be performed;
- a chuck mounted in the chamber and insulated from the chamber;
- a chuck plasma power source connected to the chuck;
- a system controller for outputting a signal for controlling the chuck plasma power source; and
- a capacitance compensator for keeping the total chuck capacitance between the chuck and a ground terminal at a constant value,
- wherein the capacitance compensator comprises:
  - a variable capacitor portion connected between the chuck and the ground terminal and comprising at least one variable capacitor; and
  - a variable capacitor controller for controlling the capacitance of the variable capacitor, wherein the variable capacitor controller comprises:
- a motive power source for changing a gap between electrodes of the variable capacitor;
- a capacitance meter for measuring the total chuck capacitance between the chuck and a ground terminal and outputting an electrical signal corresponding to the measured total chuck capacitance to the system controller;
- a manual control signal generator for generating an arbitrary voltage between positive and negative power source voltages; and
- a driver portion for driving the motive power source by amplifying the output signal of the manual control signal generator.

14. A plasma apparatus, as recited in claim 13, wherein the motive power source is a direct current motor including a rotational shaft, and the gap between the electrodes of the variable capacitor increases or decreases according to a direction of rotation of the rotational shaft.

15. A plasma apparatus, as recited in claim 13, wherein the manual control signal generator comprises:
- a power switch for selecting either the positive power source or the negative power source; and
- a variable resistor interposed between the power switch and the ground terminal, the variable resistor having a variable terminal connected to the selection switch.

16. A plasma apparatus, as recited in claim 13, wherein the driver portion comprises:
- an amplification stage connected to an output port of the manual control signal generator; and
- a driving capacitor interposed between an output port of the amplification stage and the ground terminal and connected in parallel with the motive power source.

17. A plasma apparatus, as recited in claim 16, wherein the amplification stage is a power amplifier.

18. A plasma apparatus, as recited in claim 16, further comprising an inverter interposed between the output port of the manual control signal generator and an input port of the amplification stage.

19. A plasma apparatus, as recited in claim 18, further comprising a limit control portion for limiting the range within which a driven electrode among the electrodes of the variable capacitor may be moved by the motive power source.

20. A plasma apparatus, as recited in claim 19, wherein the limit control portion comprises:
- a voltage limit setting portion for setting a negative voltage limit and a positive voltage limit;
- a limit sensor for outputting a predetermined voltage between the positive and negative power sources according to the position of the driven electrode of the variable capacitor;
- a digital comparator having a first output port for outputting a first signal when the output voltage of the limit sensor is lower than the negative voltage limit and a second output port for outputting a second signal when the output voltage of the limit sensor is higher than the positive voltage limit;
- a first rectifying device for allowing only a forward current to flow from an output port of the inverter to the input port of the inverter;
- a second rectifying device for allowing only a forward current to flow from the input port of the inverter to the output port of the inverter;
- a first switch interposed between the first rectifying device and the input port of the inverter and controlled by the first signal of the first output port of the digital comparator; and
- a second switch interposed between the second rectifying device and the input port of the inverter and controlled by the second signal of the second output port of the digital comparator.

* * * * *